United States Patent
Kinget et al.

(10) Patent No.: US 10,122,396 B2
(45) Date of Patent: *Nov. 6, 2018

(54) CIRCUITS AND METHODS FOR DETECTING INTERFERERS

(71) Applicants: Peter R. Kinget, Summit, NJ (US); John Wright, New York, NY (US); Rabia Tugce Yazicigil, New York, NY (US)

(72) Inventors: Peter R. Kinget, Summit, NJ (US); John Wright, New York, NY (US); Rabia Tugce Yazicigil, New York, NY (US)

(73) Assignee: The Trustees of Columbia University in the City of New York, New York, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/510,910

(22) PCT Filed: Sep. 14, 2015

(86) PCT No.: PCT/US2015/050058
§ 371 (c)(1),
(2) Date: Mar. 13, 2017

(87) PCT Pub. No.: WO2016/040958
PCT Pub. Date: Mar. 17, 2016

(65) Prior Publication Data
US 2017/0250716 A1    Aug. 31, 2017

Related U.S. Application Data

(60) Provisional application No. 62/049,785, filed on Sep. 12, 2014.

(51) Int. Cl.
*H04B 1/10* (2006.01)
*H03D 7/16* (2006.01)
(Continued)

(52) U.S. Cl.
CPC .......... *H04B 1/1036* (2013.01); *H03D 7/161* (2013.01); *H03F 3/19* (2013.01); *H04B 1/0017* (2013.01);
(Continued)

(58) Field of Classification Search
CPC ........ H03D 7/161; H03D 7/163; H03D 7/165; H03F 3/19; H03F 2200/294;
(Continued)

(56) References Cited

U.S. PATENT DOCUMENTS

| | | | |
|---|---|---|---|
| 5,001,441 A | 3/1991 | Gen-Kuong | |
| 5,629,956 A * | 5/1997 | Durrant | H04B 1/707 375/150 |

(Continued)

FOREIGN PATENT DOCUMENTS

| | | |
|---|---|---|
| EP | 2662706 | 9/2015 |
| WO | WO/2013/152022 | 10/2013 |

OTHER PUBLICATIONS

Adams, Douglas et al., "A Mixer Frontend for a Four-Channel Modulated Wideband Converter with 62 dB Blocker Rejection", In IEEE Radio Frequency Integrated Circuits Symposium (RFIC), San Francisco, CA, May 22-24, 2016, pp. 286-289.
(Continued)

*Primary Examiner* — Young T Tse
(74) *Attorney, Agent, or Firm* — Byrne Poh LLP

(57) ABSTRACT

Mechanisms for interferer detection can detect interferers by detecting elevated signal amplitudes in one or more of a plurality of bins (or bands) in a frequency range between a maximum frequency ($f_{MAX}$) and a minimum frequency
(Continued)

($f_{MIN}$). To perform rapid interferer detection, the mechanisms downconvert an input signal x(t) with a local oscillator (LO) to a complex baseband signal xI(t)+jxQ(t). xI(t) and xQ(t) are then multiplied by m unique pseudorandom noise (PN) sequences (e.g., Gold sequences) gm(t) to produce m branch signals for I and m branch signals for Q. The branch signals are then low pass filtered, converted from analog to digital form, and pairwise combined by a pairwise complex combiner. Finally, a support recovery function is used to identify interferers.

12 Claims, 7 Drawing Sheets

(51) Int. Cl.
　　H04L 27/22　　(2006.01)
　　H04B 17/345　(2015.01)
　　H03F 3/19　　 (2006.01)
　　H04B 1/00　　 (2006.01)

(52) U.S. Cl.
　　CPC ......... H04B 1/1027 (2013.01); H04B 17/345 (2015.01); H04L 27/22 (2013.01); *H03F 2200/294* (2013.01); *H03F 2200/451* (2013.01)

(58) Field of Classification Search
　　CPC ............ H03F 2200/451; H04B 1/0017; H04B 1/1036; H04B 1/1027; H04B 17/345; H04L 27/18; H04L 27/22; H04L 27/2273; H04L 27/2278; H04L 27/2649; H04L 2027/0057; H04L 2027/0059
　　USPC ....... 375/142, 144, 148, 150, 279–281, 329, 375/311, 332; 329/304, 306, 308
　　See application file for complete search history.

(56) References Cited

U.S. PATENT DOCUMENTS

| | | | |
|---|---|---|---|
| 5,640,416 A | 6/1997 | Chalmers | |
| 6,163,696 A * | 12/2000 | Bi | H04W 64/00 455/436 |
| 6,351,290 B1 | 2/2002 | Limberg | |
| 6,621,804 B1 * | 9/2003 | Holtzman | H04W 52/50 370/276 |
| 6,882,834 B1 | 4/2005 | Balboni | |
| 7,103,316 B1 | 9/2006 | Hall | |
| 7,266,360 B2 | 9/2007 | Kang et al. | |
| 7,787,852 B2 | 8/2010 | Rofougaran | |
| 8,166,084 B2 | 4/2012 | Hahn et al. | |
| 8,285,243 B2 | 10/2012 | Kang | |
| 8,391,340 B2 | 3/2013 | Weill | |
| 8,457,579 B2 | 6/2013 | Mishali et al. | |
| 8,571,504 B2 | 10/2013 | Robert et al. | |
| 8,594,603 B2 | 11/2013 | Balankutty et al. | |
| 8,629,714 B2 | 1/2014 | Ng et al. | |
| 8,761,065 B2 | 6/2014 | Stephens et al. | |
| 8,836,557 B2 | 9/2014 | Eldar et al. | |
| 8,971,911 B2 | 3/2015 | Barnawi | |
| 9,065,504 B2 | 6/2015 | Kwon et al. | |
| 9,191,891 B2 | 11/2015 | Jafarian et al. | |
| 9,413,420 B1 | 8/2016 | Kong | |
| 2001/0041548 A1 | 11/2001 | Bult et al. | |
| 2004/0266356 A1 | 12/2004 | Javor et al. | |
| 2006/0103362 A1 | 5/2006 | Eberlein | |
| 2006/0198474 A1 | 9/2006 | Sorrells et al. | |
| 2006/0222116 A1 | 10/2006 | Hughes et al. | |
| 2008/0069183 A1 | 3/2008 | Terada | |
| 2008/0108318 A1 | 5/2008 | Min et al. | |
| 2008/0214139 A1 | 9/2008 | Conta et al. | |
| 2009/0066446 A1 | 3/2009 | Sahu et al. | |
| 2009/0267655 A1 | 10/2009 | Chen et al. | |
| 2009/0323779 A1 | 12/2009 | Lennen | |
| 2010/0302100 A1 | 12/2010 | Yang et al. | |
| 2011/0007780 A1 | 1/2011 | Shimoni | |
| 2011/0221518 A1 | 9/2011 | Romero | |
| 2012/0144063 A1 | 6/2012 | Menchaca et al. | |
| 2012/0235801 A1 | 9/2012 | Cho et al. | |
| 2012/0249234 A1 | 10/2012 | Robert et al. | |
| 2012/0252394 A1 | 10/2012 | Balakrishnan et al. | |
| 2012/0314822 A1 | 12/2012 | Gupta | |
| 2013/0136154 A1 | 5/2013 | Chomal et al. | |
| 2013/0149983 A1 | 6/2013 | Fahim et al. | |
| 2013/0286903 A1 | 10/2013 | Khojastepour et al. | |
| 2013/0336368 A1 | 12/2013 | Arima et al. | |
| 2014/0099901 A1 | 4/2014 | Ruegamer et al. | |
| 2014/0269849 A1 | 9/2014 | Abdelmonem et al. | |
| 2014/0323071 A1 | 10/2014 | Liao | |
| 2014/0370833 A1 | 12/2014 | Din et al. | |
| 2015/0072635 A1 | 3/2015 | Atalla et al. | |
| 2015/0105067 A1 | 4/2015 | Valliappan | |
| 2016/0211872 A1 | 7/2016 | Sim et al. | |

OTHER PUBLICATIONS

Agilent Technologies, "Fundamentals of RF and Microwave Noise Figure Measurements", Technical Paper, Application Note 57-1, Aug. 5, 2010, pp. 1-31.

Agilent Technologies, "Spectrum Analysis Basics", Technical Paper, Application Note 150, Feb. 25, 2014, pp. 1-89.

Alink et al., "A 50MHz-to-1.5GHz Cross-Correlation CMOS Spectrum Analyzer for Cognitive Radio with 89dB SFDR in 1MHz RBW", in IEEE DySpan 2010, Singapore, SG, Apr. 2010, pp. 1-6.

Alink et al., "A CMOS-Compatible Spectrum Analyzer for Cognitive Radio Exploiting Crosscorrelation to Improve Linearity and Noise Performance", in IEEE Transaction on Circuits and Systems—I, vol. 59, Mar. 2012, pp. 479-492.

Alink, Mark S.O. et al., "Using Cross Correlation to Mitigate Analog/RF Impairments for Integrated Spectrum Analyzers", in IEEE Transaction on Microwave Theory and Techniques, vol. 61, No. 3, Mar. 2013, pp. 1327-1337.

Ammar, Yasmin et al., "An Ultra-Low Power Wake Up Receiver with Flip Flops Based Address Decoder", In the 12th International Multi-Conference on Systems, Signals & Devices (SSD), Sakiet Ezzit Sfax, TN, Mar. 16-19, 2015, pp. 1-5.

Anttila, Lauri et al., "Circularity-Based I/Q Imbalance Compensation in Wideband Direct-Conversion Receivers", In IEEE Transactions on Vehicular Technology, vol. 57, No. 4, Jul. 2008, pp. 2099-2113.

Bagheri et al., "An 800-MHz-6-GHz Software-Defined Wireless Receiver in 90-nm CMOS", in IEEE Journal of Solid-State Circuits, vol. 41, No. 12, Dec. 2006, pp. 2860-2688.

Bardin, Joseph C. et al., "A 0.5-20 GHz Quadrature Downconverter", In IEEE Bipolar/BiCMOS Circuits and Technology Meeting (BCTM), Monterey, CA, US, Oct. 13-15, 2008, pp. 186-189.

Bdiri, Sadok and Derbel, Faouzi, "A Nanowatt Wake-Up Receiver for Industrial Production Line", In the 11th International Mult-Conference on Systems, Signals & Devices (SSD), Barcelona, SP, Feb. 11-14, 2014, pp. 1-6.

Bdiri, Sadok and Derbel, Faouzi, "An Ultra-Low Power Wake-Up Receiver for Real-Time Constrained Wireless Sensor Networks", In the AMA Conferences 2015—SENSOR 2015 and IRS 2015, Nurnberg, DE, May 19-21, 2015, pp. 612-617.

Blaakmeer et al., "Wideband Balun-LNA With Simultaneous Output Balancing, Noise-Canceling and Distortion-Canceling", in IEEE Journal of Solid-State Circuits, vol. 43, No. 6, Jun. 2008, pp. 1341-1350.

Braun, Martin et al., "Signal Detection for Cognitive Radios with Smashed Filtering", In VTC Spring 2009—IEEE 69th Vehicular Technology Conference, Barcelona, SP, Apr. 26-29, 2009, pp. 1-5.

Bruccoleri et al., "Wide-Band CMOS Low-Noise Amplifier Exploiting Thermal Noise Canceling", in IEEE Journal of Solid-State Circuits, vol. 39, No. 2, Feb. 2004, pp. 275-282.

Candes, Emmanuel et al., "Decoding by Linear Programming", In IEEE Transactions on Information Theory, vol. 51, No. 12, Dec. 2005, pp. 4203-4215.

(56) References Cited

OTHER PUBLICATIONS

Candes, Emmanuel et al., "Robust Uncertainty Principals: Signal Reconstruction from Highly Incomplete Frequency Information", In IEEE Transactions on Information Theory, vol. 52, No. 2, Feb. 2006, pp. 489-509.
Chen et al., "A Sub-Nyquist Rate Compressive Sensing Data Acquisition Front-End", In IEEE Journal on Emerging and Selected Topics in Circuits and Systems, vol. 2, No. 3, Sep. 2012, pp. 542-551.
Davis, Geoffrey et al., "Adaptive Greedy Approximations", In Constructive Approximation, vol. 13, No. 1, Mar. 1997, pp. 57-98.
Dominguez-Jimenez, M.E. et al., "Analysis and Design of Multirate Synchronus Sampling Schemes for Sparse Multiband Signals", In the Proceedings of the 20th European Signal Processing Conference (EUSIPCO), Bucharest, ROU, Aug. 27-31, 2012, pp. 1184-1188.
Donoho D., "Compressive Sensing", Department of Statistics, Stanford University, Sep. 2004, pp. 1-34.
Donoho, David L., "For Most Large Underdetermined Systems of Equations, the minimal I Norm Near Solution Approximates the Sparsest Solution", In Communications on Pure and Applied Mathematics, vol. 59, No. 7, Jul. 2006, pp. 907-934.
Durante, Marco S. and Mahlknecht, Stefan, "An Ultra-Low Power Wake-Up Receiver for Wireless Sensor Nodes", In Proceedings of the 3rd International Conference on Sensor Technologies and Applications (SENSORCOMM '09), Athens, GR, Jun. 18-23, 2009, pp. 167-170.
Fleyer, Michael et al., "Multirate Synchronus Sampling of Sparse Multiband Signals", In IEEE Transactions on Signal Processing, vol. 58, No. 3, Mar. 2010, pp. 1144-1156.
Ghaffari et al., "Tunable N-path Notch Fillers for Blocker Suppression: Modeling and Verification", in IEEE Journal of Solid-State Circuits, vo. 48, Jun. 2013, pp. 1370-1382.
Goel et al., "A 130-nm CMOS 100-Hz-6-GHz Reconfigurable Vector Signal Analyzer and Software-Defined Receiver", In IEEE Transactions on Microwave Theory and Techniques, May 2012, pp. 1-15.
Gold, R., "Optimal Binary Sequences for Spread Spectrum Mulitplexing (Correspondence)," in IEEE Transactions on Information Theory, vol. 13, Oct. 1967, pp. 619-621.
Haque et al. "Theory and Design of a Quadrature Analog-to-InformationConverterforEnergy-Efficient Wideband Spectrum Sensing", In IEEE Transactions on Circuits and Systems—I, vol. 62, No. 2, Feb. 2015, pp. 527-535.
Homes, J., "Spread Spectrum Systems for GNSS and Wireless Communications", Artech House, May 2007, pp. 1-855.
Hsu et al., "A Sub-Sampling-Assisted Phase-Frequency Detector for Low-Noise PLLs With Robust Operation Under Supply Interference", in IEEE Transactions on Circuits and Systems—I, vol. 62, No. 1, Jan. 2015, pp. 90-99.
Hutu, Florin et al., "A New Wake-Up Radio Architecture for Wireless Sensor Networks", In EURASIP Journal on Wireless Communications and Networking, vol. 1, No. 177, Dec. 2014, pp. 1-10.
Ingels et al., "A 5mm2 40nm LP CMOS 0.1-to-3GHz Multistandard Transceiver", in in IEEE Internation Solid-State Circuits Conference, San Francisco, CA, US, Feb. 7-11, 2010, pp. 458-459.
International Preliminary Report on Patentability and Written Opinion of the International Searching Authority dated Mar. 23, 2017 in International Patent Application No. PCT/US2015/050058.
International Search Report and Written Opinion of the International Searching Authority dated Dec. 22, 2015 in International Patent Application No. PCT/US2015/50058.
Kirolos, Sami et al., "Analog-to-Information Conversion via Random Demodulation", In IEEE Dallas/CAS Workshop on Design, Applications, Integration and Software, Richardson, TX, US, Oct. 29-30, 2006, pp. 71-74.
Kitsunezuka et al., "A 30-MHz-2.4-GHz CMOS Receiver With Integrated RF Filter and Dynamic-Range-Scalable Energy Detector for Cognitive Radio Systems", in IEEE Journal of Solid-State Circuits, vol. 47, No. 5, May 2012, pp. 1084-1093.

Kitsunezuka et al., "A 5-9-mW, 0.2-2.5-GHz CMOS Low-IF Receiver for Spectrum-Sensing Cognitive Radio Sensor Networks", in IEEE Radio Frequency Integrated Circuits Symposium, Honolulu, HI, US, Jun. 4-6, 2017, pp. 319-322.
Laska, Jason N. et al., "Theory and Implementation of an Analog-to-Information Converter Using Random Demodulation", In IEEE International Symposium on Circuits and Systems, New Orleans, LA, US, May 27-30, 2007, pp. 1959-1962.
Le, Trong N. et al., "Ultra Low-Power Asynchronous MAC Protocol using Wake-Up Radio for Energy Neutral WSN", In Proceedings of the 1st International Workshop on Energy Neutral Sensing Systems, Nov. 14, 2013, Article 10, pp. 1-6.
McHenry, Mark A. et al., "Spectrum Occupancy Measurements", NeTs-ProWIN: Characterization and Impact on Network Performance, Shared Spectrum Company, Dec. 20, 2005, pp. 1-58.
Miar, Yasin et al., "A Novel Reduced Power Compressive Sensing Technique for Wideband Cognitive Radio", In EURASIP Journal on Wireless Communications and Networking, Dec. 2012, pp. 281.
Mirzaei et al., "Analysis and Optimization of Current-Driven Passive Mixers in Narrowband Direct-Conversion Receivers", in IEEE Journal of Solid-State Circuits, vol. 44, No. 10, Oct. 2009, pp. 2678-2688.
Mishali, Moshe et al, "From Theory to Practice: Sub-Nyqust Sampling of Sparse Wideband Analog Signals", In IEEE Journal of Selected Topics in Signal Processing, vol. 4, No. 2, Apr. 2010, pp. 375-391.
Mishali, Moshe et al, "Wideband Spectrum Sensing at Sub-Nyquist Rates", In IEEE Signal Processing Magazine, vol. 28, No. 4, Jul. 2011, pp. 102-135.
Mishali, Moshe et al., "Blind Multiband Signal Reconstruction: Compressed Sensing for Analog Signals", in IEEE Transactions on Signal Processing, vol. 57, No. 3, Mar. 2009, pp. 993-1009.
Mitola III, Joseph, "Cognitive Radio for Flexible Mobile Mulitmedia Communications", In Mobile Networks and Applications, vol. 6, No. 5, Sep. 2001, pp. 435-441.
Murmann, B., "ADC Performance Survey 1997-2015", last updated Jul. 2016, pp. 1-4, available at: http://web.stanford.edu/~murmann/adcsurvey.html.
Murphy, David et al., "A Blocker-Tolerant Wideband Noise-Cancelling Receiver with a 2dB Noise Figure", In IEEE International Solid-State Circuits Conference (ISSCC), San Francisco, CA, US, Feb. 19-23, 2012, pp. 74-76.
Office Action dated Dec. 16, 2016 in U.S. Appl. No. 15/285,474.
Oller, Joaquim et al., "Design, Development, and Performance Evaluation of a Low-Cost, Low-Power Wake-Up Radio System for Wireless Sensor Networks", In ACM Transactions on Sensor Networks (TOSN), vol. 10, No. 1, Nov. 2013, Article 11, pp. 1-24.
Pandey, Jagdish and Otis, Brian R., "A Sub-100 μW MICS/ISm Band Transmitter Based on Injection-Locking and Frequency Multiplication", In IEEE Journal of Solid-State Circuits, vol. 46, No. 5, May 2011, pp. 1049-1058.
Park et al., "A Fully Integrated UHF-Band CMOS Receiver With Multi-Resolution Spectrum Sensing (MRSS) Functionality for IEEE 802.22 Cognitive Radio Applications", in IEEE Journal of Solid-State Circuits, vol. 44, No. 1, Jan. 2009, pp. 258-268.
Pickholtz, Raymond L. et al, "Theory of Spread-Spectrum Communications—A Tutorial", In IEEE Transactions on Comminications, vol. 30, No. 5, May 1982, pp. 855-884.
Pletcher, Nathan M. et al., "A 52 μW Wake-Up Receiver with 72-dBm Sensitivity using an Uncertain-IF Architecture", In the IEEE Journal of Solid-State Circuits, vol. 44, No. 1, Jan. 2009, pp. 269-280.
Pletcher, Nathan M., "Ultra-Low Power Wake-Up Receivers for Wireless Sensor Networks", Technical Report, Department of Electrical Engineering and Computer Sciences, Univeristy of California, Berkeley, CA, US, May 20, 2008, pp. 1-164.
Pollin et al., "Digital and Analog Solution for Low-power Multiband Sensing", in IEEE DySPAN 2010, Singapore, SG, Apr. 6-9, 2010, pp. pp. 1-2.
Polo, Yvan L. et al., "Compressive Wide-Band Spectrum Sensing", In IEEE International Conference on Acoustics, Speech and Signal Processing (ICASSP), Taipei, TW, Apr. 19-24, 2009, pp. 2337-2340.

(56) References Cited

OTHER PUBLICATIONS

Razavi, B., "Design Considerations for Direct-Conversion Receivers", In IEEE Transactions on Circuits and Systems, vol. 44, No. 6, Jun. 1997, pp. 428-435.
Razavi, B., "Design of Analog CMOS Integrated Circuits", 1st Edition, McGraw Hill, 2001 (month unknown), pp. 1-684.
Razavi, B., "RF Microelectronics", Second Edition, Prentice Hall, 1998 (month unknown), pp. 1-960.
Roberts, Nathan E. and Wentzloff, David D., "A 98nW Wake-Up Radio for Wireless Body Area Networks", In the IEEE Radio Frequency Integrated Circuits Symposium (RFIC '12), Montreal, CA, Jun. 17-19, 2012, pp. 373-376.
Roberts, Nathan E. et al., "A 236nW-56.5dBm-Sensitivity Bluetooth Low-Energy Wakeup Receiver with Energy Harvesting in 65nm CMOS", In Proceedings of the International Solid-State Circuits Conference (ISSCC), San Francisco, CA, US, Feb. 11-15, 2016, pp. 450-451.
Salazar et al., "A 2.4 GHz Interferer-Resilient Wake-Up Receiver Using a Dual-IF Multi-Stage N-Path Architecture", In the IEEE Journal of Solid-State Physics, vol. 51, No. 9, Sep. 2016, pp. 2091-2110.
Selva, J., "Regularized Sampling of Multiband Signals", In IEEE Transactions on Signal Processing, vol. 58, No. 11, Nov. 2010, pp. 5624-5638.
Soer et al., "0.2-to-2.0GHz 65nm CMOS Receiver Without LNA Achieving >11dBm IIP3 and <6.5 dB NF", in IEEE International Solid-State Circuits Conference Digest of Technical Papers, Feb. 12, 2009, pp. 222-223.
Stoopman, Mark et al., "Co-Design of a CMOS Rectifier and Small Loop Antenna for Highly Sensitive RF Energy Harvesters", In the IEEE Journal of Solid-State Circuits, vol. 49, No. 3, Mar. 2014, pp. 622-634.
Tian, Zhi and Giannakis, Georgios B., "Compressed Sensing for Wideband Cognitive Radios", In IEEE International Conference on Acoustics, Speech and Signal Processing (ICASSP), Honolulu, HI, US, Apr. 15-20, 2007, Article 4, pp. 1357-1360.
Tropp et al., "Beyond Nyquist: Efficient Sampling of Sparse Bandlimited Signals", in IEEE Transactions on Information Theory, vol. 56, Jan. 2010, pp. 520-544.
Tropp et al., "Signal Recovery from Random Measurements via Orthogonal Matching Pursuit", In IEEE Transactions on Information Theory, vol. 53, No. 12, Dec. 2007, pp. 4655-4666.
Umbdenstock, Emeric et al., "Wake-Up-Receiver in Energy Efficient Wireless Sensor Networks for Security Applications", In Proceedings of the 7th Edition of the Interdisciplinary Workshop on Global Security, 2013, pp. 1-4.
Viitala et al., "A Wideband Under-Sampling Blocker Detector with a 0.7-2.7GHz Mixer First Receiver", In the Proceedings of the 2015 Radio Frequency Inegrated Circuits Symposium, Phoenix, AZ, US, May 2015, pp. 1-4.
Wang, Yue et al., "A Two-Step Compressed Spectrum Sensing Scheme for Wideband Cognitive Radios", In IEEE Global Telecommunications Conference (GLOBECOM), Miami, FL, US, Dec. 6-10, 2010, pp. 1-5.
Wohlmuth, Hans-Dieter and Kehrer, Daniel, "A Low Power 13-Gb/s 2^17-1 Pseudo Random Bit Sequence Generator IC in 120 nm Bulk CMOS", In Proceedings of the 17th Symposium on Integrated Circuits and System Design, Pernambuco, BR, Sep. 7-11, 2004, pp. 233-236.
Yang, Xianjun et al., "Random Circulant Orthogonal Matrix Based Analog Compressed Sensing", In IEEE Global Communications Conference (GLOBECOM), Anaheim, CA, US, Dec. 3-7, 2012, pp. 3605-3609.
Yazicigil et al., "A 2.7-to-3.7GHz Rapid Interferer Detector Exploiting Compressed Sampling with a Quadrature Analog-to-Information Converter", in IEEE Solid-State Circuits Conference, San Francisco, CA, US, Feb. 2015, pp. 1-3.
Ye et al., "An Ultra-Low-Power Receiver Using Transmitted-Reference and Shifted Limiters for In-Band Interference Resilience", In the Proceedings of the IEEE Solid-Slate Circuits Conference, San Francisco, CA, US, Jan.-Feb. 2016, pp. 438-439.
Yoo, Juhwan et al., "A 100MHz-2GHz 12.5x sub-Byquist Rate Receiver in 90nm CMOS", In IEEE Radio Frequency Integrated Circuits Symposium, Montreal, CA, Jun. 17-19, 2012, pp. 31-34.
Yu et al.,"A 0.042-mm2 Fully Integrated Analog PLL with Stacked Capacitor-Inductor in 45nm CMOS", in the Proceedings of the European Solid-State Circuits Conference, Edinburgh, UK, Sep. 2008, pp. 94-97.
Yu, Zhuizhuan et al., "Mixed-Signal Parallel Compressed Sensing and Reception for Cognitive Radio", In IEEE International Conference on Acoustics, Speech and Signal Processing, Las Vegas, NV, US, Mar. 31-Apr. 4, 2008, pp. 3861-3864.
Zhang, Tong, "Sparse Recovery with Orthogonal Matching Pursuit Under Rip", In IEEE Transactions on Information Theory, vol. 57, No. 9, Sep. 2011, pp. 6215-6221.
Andrews, C. and Molnar, A., "A Passive Mixer-First Receiver With Digitally Controlled and Widely Tunable RF Interface", In IEEE Journal of Solid-State Circuits, vol. 45, No. 12, Dec. 2010, pp. 2696-2708.
Andrews, C. and Molnar, A., "A Passive-Mixer-First Receiver with Baseband-Controlled RF Impedance Matching, 6dB NF, and 27dBm Wideband IIP3", in IEEE International Solid-State Circuits Conference (ISSCC) Digest of Technical Papers, San Francisco, CA, US, Feb. 7-11, 2010, pp. 46-47.
Aparin, V. et al., "An Integrated LMS Adaptive Filter of TX Leakage for CDMA Receiver Front Ends", In IEEE Journal of Solid-State Circuits, vol. 41, No. 5, May 2006, pp. 1171-1182.
Aparin, V., "A New Method of TX Leakage Cancelation in W/CDMA and GPS Receivers", In IEEE Proceedings of the Radio Frequency Integrated Circuits Symposium (RFIC '08), Digest of Technical Papers, Atlanta, GA, US, Jun. 15-17, 2008, pp. 87-90.
Ayazian, S. and Gharpurey, R., "Feedforward Interference Cancellation in Radio Receiver Front-ends", In IEEE Transactions in Circuits and Systems II: Express Briefs, vol. 54, No. 10, Oct. 2007, pp. 902-906.
Balankutty, A. and Kinget, P., "An Ultra-Low Voltage, Low-Noise, High Linearity 900-MHz Receiver With Digitally Calibrated In-Band Feed-Forward Interferer Cancellation in 65-nm CMOS", In IEEE Journal of Solid-State Circuits, vol. 46, No. 10, Oct. 2011, pp. 2268-2283.
Borremans, J. et al. "Low-area Active-feedback Low-noise Amplifier Design in Scaled Digital CMOS", In IEEE Journal of Solid-State Circuits, vol. 43, No. 11, Nov. 2008, pp. 2422-2433.
Chen, R. and Hashemi, H., "A 0.5-to-3 GHz Software-Defined Radio Receiver using Sample Domain Signal Processing", In Proceedings of IEEE Radio Frequency Integrated Circuits Symposium (RFIC), Seattle, WA, US, Jun. 2-4, 2013, pp. 315-318.
Cherry, E. and Hooper, D., "The Design of Wide-Band Transistor Feedback Amplifiers", in Proceedings of the Institution of Electrical Engineers, vol. 110, No. 2, Feb. 1963, pp. 375-389.
Darabi, H. et al., "Highly Integrated and Tunable RF Front Ends for Reconfigurable Multiband Transceivers: A Tutorial", In IEEE Transactions on Circuits and Systems I: Regular Papers, vol. 58, No. 9, Sep. 2011, pp. 2038-2050.
Darabi, H., "A Blocker Filtering Technique for SAW-Less Wireless Receivers", in IEEE Journal of Solid-State Circuits, vol. 42, No. 12, Dec. 2007, pp. 2766-2773.
Darvishi, M. et al., "A 0.1-to-1.2GHz Tunable 6th-Order N-Path Channel-Select Filter with 0.6dB Passband Ripple and +7dBm Blocker Tolerance", in Papers IEEE International Solid-State Circuits Conference (ISSCC) Digest of Technical, San Francisco, CA, US, Feb. 2013, pp. 172-174.
Fong, K.L., "Dual-band High-linearity Variable-gain Low-noise Amplifiers for Wireless Applications", In IEEE International Solid-State Circuits Conference (ISSCC) Digest of Technical Papers, Feb. 1999, pp. 224-225.
Geis, A. et al., "A 0.045mm2 0.1-6GHz Reconfigurable Multi-Band, Multi-Gain LNA for SDR", In Proceedings of IEEE Radio Frequency Integrated Circuits Symposium (RFIC), Anaheim, CA, US, May 23-25, 2010, pp. 123-126.

(56) References Cited

OTHER PUBLICATIONS

Ghaffari, A. et al., "8-Path Tunable RF Notch Filters for Blocker Suppression", In IEEE International Solid-State Circuits Conference (ISSCC) Digest of Technical Papers, Feb. 2012, pp. 76-78.
Ghaffari, A. et al., "Tunable High-Q N-Path Band-Pass Filters: Modeling and Verification", In IEEE Journal of Solid-State Circuits, vol. 46, No. 5, May 2011, pp. 1-29.
Giannini, V. et al., "A 2-mm 0.1-5 GHz Software-defined Radio Receiver in 45-nm Digital CMOS", In IEEE Journal of Solid-State Circuits, vol. 44, No. 12, Dec. 2009, pp. 3486-3498.
Han, H.G. and Kim, T.W., "A CMOS RF Programmable-Gain Amplifier for Digital TV With a +9-dBm IIP3 Cross-Coupled Common-Gate LNA", In IEEE Transactions on Circuits and Systems II: Express Briefs, vol. 59, No. 9, Sep. 2012, pp. 543-547.
He, X. and Kundur, H., "A Compact SAW-less Multiband WCDMA/GPS Receiver Front-End with Translational Loop for Input Matching", In IEEE International Solid-State Circuits Conference (ISSCC) Digest of Technical Papers, Apr. 2011, pp. 372-374.
International Preliminary Report on Patentability of the International Searching Authority dated Aug. 9, 2016 in International Patent Application No. PCT/US2015/015036.
International Search Report and Written Opinion dated Jan. 4, 2018 in International Patent Application No. PCT/US2017/057923.
International Search Report and Written Opinion dated Oct. 23, 2015 in International Patent Application No. PCT/US2015/015036.
Izquierdo, C. et al., "Reconfigurable Wide-band Receiver with Positive Feed-back Translational Loop", In Proceedings of IEEE Radio Frequency Integrated Circuits Symposium (RFIC), Baltimore, MD, US, Jun. 5-7, 2011, pp. 1-4.
Izquierdo, C. et al., "Wide-band Receiver Architecture with Flexible Blocker Filtering Techniques", In Proceedigns of IEEE International Conference on Electronics, Circuits, Systems (ICECS), Athens, GR, Dec. 12-15, 2010, pp. 894-897.
Kaltiokallio, M. et al., "Wideband 2 to 6 GHz RF Front-end with Blocker Filtering", In IEEE Journal Solid-State Circuits, vol. 47, No. 7, Jul. 2012, pp. 1636-1645.
Mirzaei, A. et al., "A 65 nm CMOS Quad-band SAW-less Receiver SoC for GSM/GPRS/EDGE", In IEEE Journal of Solid-State Circuits, vol. 46, No. 4, Apr. 2011, pp. 950-964.
Murphy, D. et al., "A Blocker-Tolerant, Noise-Cancelling Receiver Suitable for Wideband Wireless Applications", In IEEE Journal of Solid-State Circuits, vol. 47, No. 12, Dec. 2012, pp. 2943-2963.
Notice of Allowance dated May 8, 2017 in U.S. Appl. No. 15/285,474.
Notice of Allowance dated Dec. 13, 2017 in U.S. Appl. No. 15/117,662.
Office Action dated May 11, 2018 in U.S. Appl. No. 15/676,610.
Office Action dated May 19, 2017 in U.S. Appl. No. 15/117,662.
Park, J.W. and Razavi, B., "A 20 mW GSM/WCDMA Receiver with RF Channel Selection", In Proceedings of IEEE International Solid-State Circuits Conference (ISSCC), San Francisco, CA, US, Feb. 9-14, 2014, pp. 356-358.
Sen, S. et al., "A Power-Scalable Channel-Adaptive Wireless Receiver Based on Built-In Orthogonally Tunable LNA", in Transactions on Circuits and Systems I: Regular Papers, vol. 59, No. 5, May 2012, pp. 946-957.
Steyaert, M. and Craninckx, J., "1.1 GHz Oscillator Using Bondwire Inductance", In Electronics Letters, vol. 30, No. 3, Feb. 3, 1994, pp. 244-245.
Sturm, J. et al., "A 65nm CMOS Wide-band LNA with Continuously Tunable Gain from 0dB to 24dB", In Proceedings of IEEE International Symposium on Circuits and Systems (ISCAS), Beijing, CN, May 19-23, 2013, pp. 733-736.
Wang, Y.H. et al., "A 2.1 to 6 GHz Tunable-band LNA With Adaptive Frequency Responses by Transistor Size Scaling", in IEEE Microwave and Wireless Components Letters, vol. 20, No. 6, Jun. 2010, pp. 346-348.
Werth, T. et al., "Active Feedback Interference Cancellation in RF Receiver Front-End", in Proceedings of IEEE Radio Frequency Integrated Circuits Symposium (RFIC), Boston, MA, US, Boston, MA, US, Jun. 7-9, 2009, pp. 379-382.
Werth, T. et al., "An Active Feedback Interference Cancellation Technique for Blocker Filtering in RF Receiver Front-Ends", In IEEE Journal of Solid-State Circuits, vol. 45, No. 5, May 2010, pp. 989-997.
Youssef, S. et al., "Active Feedback Receiver with Integrated Tunable RF Channel Selectivity, Distortion Cancelling, 48dB Stopband Rejection and .+12Bm Wideband IIP3, Occupying 0.06mm2 in 65nm CMOS", in Proceedings of IEEE ISSCC, San Francisco, CA, US, Feb. 19-23, 2012, pp. 166-168.
Zhang, H. and Sanchez-Sinencio, E., "Linearization Techniques for CMOS Low Noise Amplifiers: A Tutorial", in IEEE Transactions on Circuits and Systems I: Regular Papers, Jan. 2011, vol. 58, No. 1, pp. 22-36.
Zhou, W. et al., "Using Capacitive Cross-coupling Technique in RF Low Noise Amplifiers and Down-conversion Mixer Design", In Proceedings of the European Solid-State Circuits Conference (ESSCIRC), Stockholm, SE, Sep. 19-21, 2000, pp. 77-80.

\* cited by examiner

CIRCUITS AND METHODS FOR DETECTING INTERFERERS

CROSS-REFERENCE TO RELATED APPLICATION

This application claims the benefit of U.S. Provisional Patent Application No. 62/049,785, filed Sep. 12, 2015, which is hereby incorporated by reference herein in its entirety.

STATEMENT REGARDING FEDERALLY SPONSORED RESEARCH OR DEVELOPMENT

This invention was made with government support under grants 1002064 and 1343282 awarded by the NSF. The government has certain rights in the invention.

BACKGROUND

As more and more devices utilize radio frequency techniques to effect wireless communication and control, available spectral resources become fewer and fewer. In attempt to address this situation, certain techniques, such as cognitive radio, allow opportunistic use of available spectral resources.

In many of these techniques, before a device can use a certain part of the radio frequency spectrum, it is desirable for the device to first determine whether there are interferers that may interfere with the device's use of the part of the spectrum.

While certain techniques for detecting interferers exist, these techniques are slow or energy inefficient.

Accordingly, new mechanisms for detecting interferers are desired.

SUMMARY

In accordance with some embodiments, circuits and methods for detecting interferers are provided. In some embodiments, circuits for detecting interferers are provided, the circuits comprising: a first in-phase mixer that receives and mixes a radio frequency (RF) signal and an in-phase local oscillator signal to produce a first in-phase mixer output signal; a first quadrature-phase mixer that receives and mixes the radio frequency (RF) signal and a quadrature-phase local oscillator signal to produce a first quadrature-phase mixer output signal; a first in-phase filter that receives and filters the first in-phase mixer output signal and produces a first in-phase filtered signal; a first quadrature-phase filter that receives and filters the first quadrature-phase mixer output signal and produces a first quadrature-phase filtered signal; a first in-phase branch that comprises: a second in-phase mixer that receives and mixes the first in-phase filtered signal and a first pseudorandom noise signal to produce a second in-phase mixer output signal; a second in-phase filter that receives and filters the second in-phase mixer output signal to produce a second in-phase filtered signal; and a first in-phase analog-to-digital converter that receives the second in-phase filtered signal and produces a first in-phase digitized signal; a second in-phase branch that comprises: a third in-phase mixer that receives and mixes the first in-phase filtered signal and a second pseudorandom noise signal to produce a third in-phase mixer output signal; a third in-phase filter that receives and filters the third in-phase mixer output signal to produce a third in-phase filtered signal; and a second in-phase analog-to-digital converter that receives the third in-phase filtered signal and produces a second in-phase digitized signal; a first quadrature-phase branch that comprises: a second quadrature-phase mixer that receives and mixes the first quadrature-phase filtered signal and the first pseudorandom noise signal to produce a second quadrature-phase mixer output signal; a second quadrature-phase filter that receives and filters the second quadrature-phase mixer output signal to produce a second quadrature-phase filtered signal; and a first quadrature-phase analog-to-digital converter that receives the second quadrature-phase filtered signal and produces a first quadrature-phase digitized signal; a second quadrature-phase branch that comprises: a third quadrature-phase mixer that receives and mixes the first quadrature-phase filtered signal and the second pseudorandom noise signal to produce a third quadrature-phase mixer output signal; a third quadrature-phase filter that receives and filters the third quadrature-phase mixer output signal to produce a third quadrature-phase filtered signal; and a second quadrature-phase analog-to-digital converter that receives the third quadrature-phase filtered signal and produces a second quadrature-phase digitized signal; a complex combiner that combines the first in-phase digitized signal and the first quadrature-phase digitized signal to produce a first combined signal and that combines the second in-phase digitized signal and the second quadrature-phase digitized signal to produce a second combined signal; and at least one hardware processor that receives the first combined signal and the second combined signal and that identifies at least one interferer in the RF signal using the first combined signal and the second combined signal.

In some embodiments, methods for detecting interferers are provided, the methods comprising: mixing a radio frequency (RF) signal and an in-phase local oscillator signal to produce a first in-phase mixer output signal; mixing the radio frequency (RF) signal and a quadrature-phase local oscillator signal to produce a first quadrature-phase mixer output signal; filtering the first in-phase mixer output signal to produce a first in-phase filtered signal; filtering the first quadrature-phase mixer output signal to produce a first quadrature-phase filtered signal; mixing the first in-phase filtered signal and a first pseudorandom noise signal to produce a second in-phase mixer output signal; filtering the second in-phase mixer output signal to produce a second in-phase filtered signal; analog-to-digital converting the second in-phase filtered signal to produce a first in-phase digitized signal; mixing the first in-phase filtered signal and a second pseudorandom noise signal to produce a third in-phase mixer output signal; filtering the third in-phase mixer output signal to produce a third in-phase filtered signal; analog-to-digital converting the third in-phase filtered signal to produce a second in-phase digitized signal; mixing the first quadrature-phase filtered signal and the first pseudorandom noise signal to produce a second quadrature-phase mixer output signal; filtering the second quadrature-phase mixer output signal to produce a second quadrature-phase filtered signal; analog-to-digital converting the second quadrature-phase filtered signal to produce a first quadrature-phase digitized signal; mixing the first quadrature-phase filtered signal and the second pseudorandom noise signal to produce a third quadrature-phase mixer output signal; filtering the third quadrature-phase mixer output signal to produce a third quadrature-phase filtered signal; analog-to-digital converting the third quadrature-phase filtered signal to produce a second quadrature-phase digitized signal; combining the first in-phase digitized signal and the first quadrature-phase digitized signal to produce a first combined signal and combining the second in-phase digitized signal and the second quadrature-phase digitized signal to produce a second combined signal; and identifying at least one interferer in the RF signal using the first combined signal and the second combined signal.

BRIEF DESCRIPTION OF THE DRAWINGS

Various objects, features, and advantages of the disclosed subject matter can be more fully appreciated with reference to the following detailed description of the disclosed subject matter when considered in connection with the following drawings, in which like reference numerals identify like elements.

DETAILED DESCRIPTION

In accordance with some embodiments, mechanisms (which can include circuits, systems, methods, and computer readable media) for detecting interferers in a frequency range are provided.

The mechanisms described herein for interferer detection can detect interferers by detecting elevated signal amplitudes in one or more of a plurality of bins (or bands) in a frequency range between a maximum frequency ($f_{MAX}$) and a minimum frequency ($f_{MIN}$) in some embodiments. Any suitable number of bins (or bands) (which number is referred to herein as $N_0$) can be used, and any suitable maximum and minimum frequencies can be used, in some embodiments.

Figure 1:
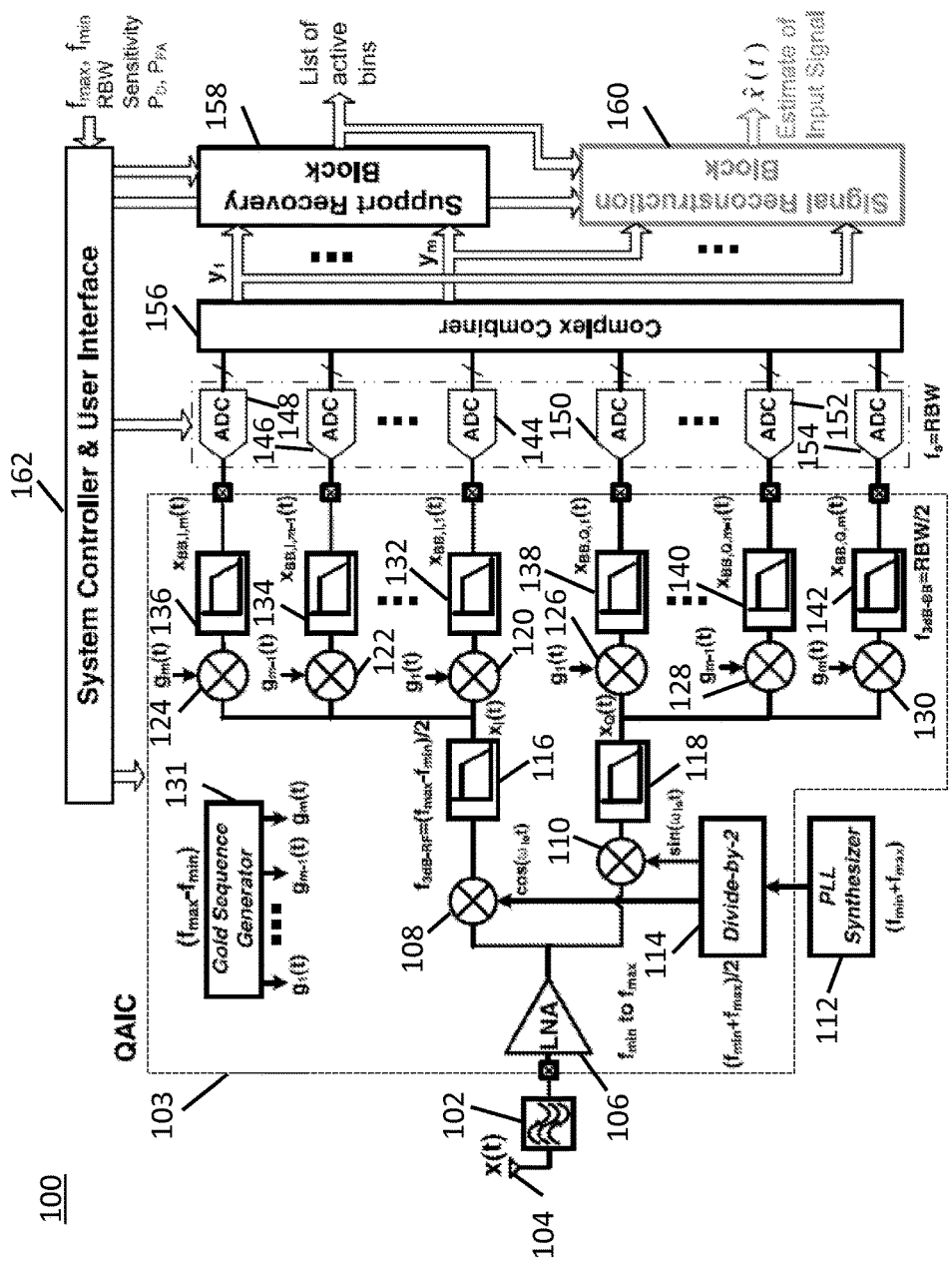
FIG. 1 is an example of a circuit for detecting interferers in accordance with some embodiments.

Turning to FIG. 1, an example 100 of a circuit for interferer detection in accordance with some embodiments is shown. As illustrated, circuit 100 includes an antenna 104, a quadrature analog-to-information converter (QAIC) front-end 103, a local oscillator source 112, analog-to-digital converters (ADCs) 144, 146, 148, 150, 152, and 154, a complex combiner 156, a support recovery block 158, a signal reconstruction block 160, and a system controller and user interface 162.

In accordance with some embodiments, to perform rapid interferer detection, circuit 100 downconverts an input signal x(t) with a local oscillator (LO) to a complex baseband signal $x_I(t)+jx_Q(t)$. $x_I(t)$ and $x_Q(t)$ are then multiplied by m unique pseudorandom noise (PN) sequences (e.g., Gold sequences) $g_m(t)$ to produce m branch signals for I and m branch signals for Q. The branch signals are then low pass filtered, converted from analog to digital form, and pairwise combined by a pairwise complex combiner. Finally, a support recovery function is used to identify interferers.

As shown in FIG. 1, QAIC front-end 103 includes a low noise amplifier (LNA) 106, mixers 108 and 110, a divide-by-two circuit 114, filters 116 and 118, mixers 120, 122, 124, 126, 128, and 130, filters 132, 134, 136, 138, 140, and 142, and a Gold sequence generator 131.

When an input signal x(t) is filtered by a filter 102 and received from antenna 104, the filtered input signal is amplified by LNA 106. LNA 106 can be any suitable low noise amplifier in accordance with some embodiments. In some embodiments, a wideband noise-canceling low-noise amplifier can be used as LNA 106. A wideband noise-canceling low-noise amplifier can be used as LNA 106, for example, when impedance matching is required for a given instantaneous bandwidth (e.g., 1 GHz).

The output of LNA 106 is then provided to mixers 108 and 110, which mix the amplified signal with local oscillators $\cos(\omega_{lo}t)$ and $\sin(\omega_{lo}t)$, respectively. Mixers 108 and 110 can be any suitable mixers. For example, in some embodiments, the mixers can be current-driven passive I/Q mixers.

The local oscillators can be produced by any suitable source. For example, in some embodiments, the local oscillators can be produced by local oscillator source 112 in conjunction with divide-by-two circuit 114. Local oscillator source 112 can be any suitable source of a local oscillator signal, such as a phase lock loop synthesizer. The local oscillators can have any suitable frequency. For example, the local oscillator signal produced by source 112 can have a frequency of 6.4 GHz, and the local oscillators output by circuit 114 can be 3.2 GHz quadrature signals that have a 50% duty cycle.

The outputs of mixers 108 and 110 are filtered by filters 116 and 118 to produce $x_I(t)$ and $x_Q(t)$, respectively. Any suitable filters can be used for filters 116 and 118 in accordance with some embodiments. For example, low pass filters with a cut-off frequency of 0.5 GHz can be used for filters 116 and 118 in some embodiments.

Next, the signals $x_I(t)$ and $x_Q(t)$ output by filters 116 and 118 are provided to m branches for each of the I and Q paths for a total of M=2 m branches. Any suitable number of branches can be used in some embodiments. For example, in some embodiments, the total number of branches M needed for successful signal recovery can be determined by the maximum number of supports (i.e., interferers), $K_0$, the length of the PN sequence, L, and a constant, C according to the equation: $M = C \cdot K_0 \cdot \log(L/K_0)$.

For the purposes of illustration, FIG. 1 shows one three of the m in-phase branches and three of the m quadrature-phase branches. In some embodiments, m may be equal to eight or any other suitable number. Within these three illustrative branches, the signal $x_I(t)$ is provided to mixers 120, 122, and 124, and the signal $x_Q(t)$ is provided to mixers 126, 128, and 130. Any suitable mixers can be used in some embodiments. For example, in some embodiments, the mixers can be current-driven passive I/Q mixers.

Mixers 120, 122, and 124 and mixers 126, 128, and 130 mix signals $x_I(t)$ and $x_Q(t)$, respectively, with unique Gold sequence $g_1(t)$, $g_{m-1}(t)$, and $g_m(t)$ for each branch m. More particularly, for example, mixers 120 and 126 mix signals $x_I(t)$ and $x_Q(t)$, respectively, with Gold sequence $g_1(t)$. As another example, mixers 122 and 128 mix signals $x_I(t)$ and $x_Q(t)$, respectively, with Gold sequence $g_{m-1}(t)$. As yet another example, mixers 128 and 130 mix signals $x_I(t)$ and $x_Q(t)$, respectively, with Gold sequence $g_m(t)$.

The Gold sequences can have any suitable length in some embodiments. For example, in some embodiments, the Gold sequences can have a length of 15, 31, 63 or 127.

Although FIG. 1 is described as mixing Gold sequences with $x_I(t)$ and $x_Q(t)$, any suitable pseudo random sequence (PRBS) can be used in some embodiments.

As another example, in some embodiments, maximal length PRBSs generated with linear feedback shift registers (LFSR) can be used. The sequence length L can be equal to $2^r-1$, where $r \in \mathbb{Z}^+$ for a maximal length LFSR type PRBS. The number of shift registers r in the LFSR structure can be chosen such that L is greater than or equal to the number of bins (or bands) in the frequency range $(f_{MAX}-f_{MIN})$ (e.g., 1 GHz (3.7 GHz $(f_{MAX})$–2.7 GHz $(f_{MIN})$) to be checked for interferers and the frequency of the PRBS $(f_{PRBS})$ is greater than the frequency span.

The output of mixer in each of the in-phase and quadrature phase branches (e.g., mixers 120, 122, 124, 126, 128, and 130) is filtered by a filter for that branch (e.g., one of filters 132, 134, 136, 138, 140, and 142). Any suitable filters can be used for these filters in accordance with some embodiments. For example, low pass filters with a cut-off frequency of RBW/2 (e.g., 10 MHz) can be used for these filters in some embodiments.

The output of the filters in each of the in-phase and quadrature phase branches (e.g., filters 132, 134, 136, 138, 140, and 142) is converted from analog to digital by an ADC for that branch (e.g., one of ADCs 144, 146, 148, 150, 152, and 154). Any suitable ADCs can be used for these ADCs in accordance with some embodiments, and these ADCs can have any suitable number of bits and sampling rate. For example, in some embodiments, 1 or 8 bit ADCs with sampling rates of equal to the RBW, or multiples thereof can be used.

The aggregate sampling rate for the ADCs is the number of branches multiplied by the sampling rate for each ADC. In some embodiments, the number of branches may be reduced by a factor q if the branch sampling rate is increased by a factor q to maintain the same aggregate sampling rate.

The outputs of the I and Q path branches are next pairwise added by complex combiner 156. As shown in block 302 of FIG. 3, this can be done by the complex combiner providing an output y for each pair of I and Q branches 1 through m as follows:

$$y_i = x_{BBIi} + j x_{BBQi}$$

The outputs of the complex combiner $y_1 \ldots y_m$ are provided to support recovery block 158 and signal reconstruction block 160.

Figure 3:
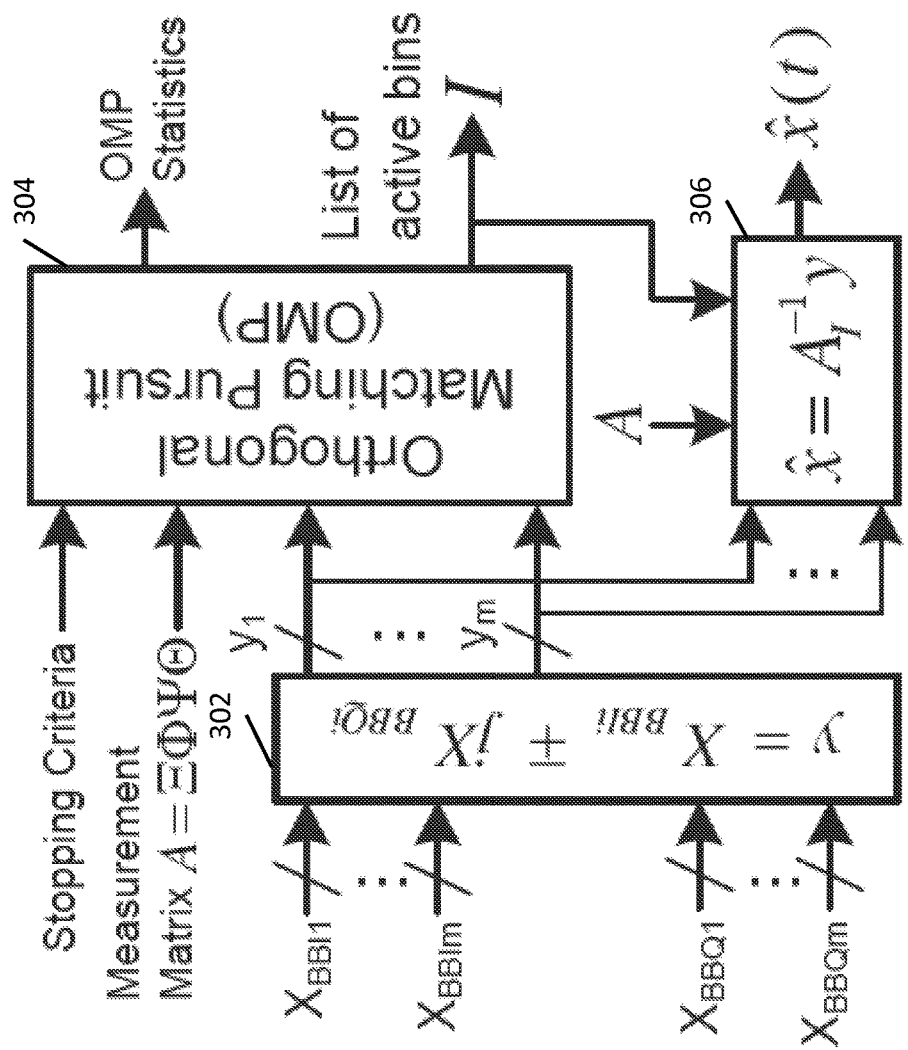
FIG. 3 is an example of a block diagram showing functions that can be performed by a complex combiner, a support recovery block, and a signal reconstruction block in accordance with some embodiments.

Within support recovery block 158, any suitable technique and any suitable hardware can be used to identify interferers. For example, in some embodiments, as shown in FIG. 3, the Orthogonal Matching Pursuit (OMP) technique (shown in block 304) can be used to find the input signal frequency bins (or bands) that exceed an adaptive threshold, and thus certain interferers. The OMP forms an estimate of the signal support (i.e., interferers) (active bins) one element at a time.

As also shown in FIG. 3, in addition to receiving the outputs of the complex combiner, the OMP receives stopping criteria and a measurement matrix A. Any suitable stopping criteria and measurement matrix A can be used in some embodiments. For example, in some embodiments, user specified parameters like $f_{MAX}$, $f_{MIN}$ and resolution bandwidth (RBW) (i.e., the frequency range divided by the number of bins (or bands)) can be used to generate the measurement matrix A, and user specified performance targets like sensitivity can be used to derive the adaptive stopping criteria. This threshold can be set to optimize the detection or false alarm probabilities, $P_D$ or $P_{FA}$. For example, the threshold can be set close to the noise floor to maximize performance in some embodiments.

Within signal reconstruction block 160, any suitable technique and any suitable hardware can be used to reconstruct the signal x(t). For example, as shown in FIG. 3, in some embodiments, the list (I) of active bins found by the OMP at block 304 can be used to reconstruct an estimate of the input signal x(t) at block 306. This can be done, for example, by forming a pseudoinverse of the reduced measurement matrix $(A_I)$, and solving directly for x(t) from the complex combiner output values y.

Finally, system controller and user interface 162 can be used to configure circuit 100 according to user specified system constants and performance targets such as RBW, sensitivity, maximum and minimum frequencies of interest, $f_{MAX}$ and $f_{MIN}$, and detection and false alarm probabilities, $P_D$ and $P_{FA}$.

Figure 2:
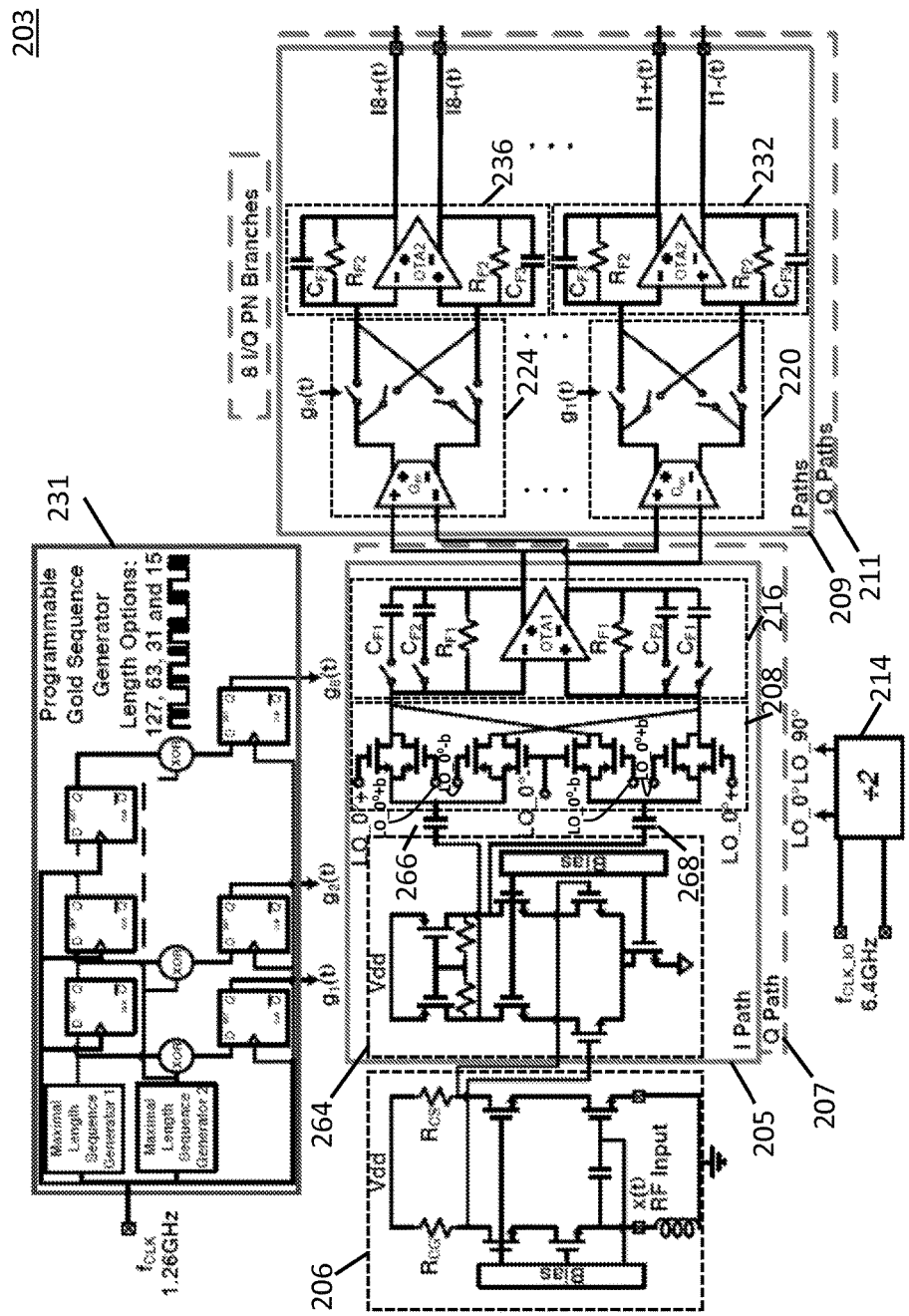
FIG. 2 is an example of a circuit for implementing a quadrature analog-to-information converter in accordance with some embodiments.

Turning to FIG. 2, an example 203 of a circuit for QAIC front-end 103 that can be used in accordance with some embodiments is illustrated. As shown, circuit 203 includes an LNA 206, a mixer 208, a transconductance amplifier 264, DC blocking capacitors 266 and 268, a divide-by-two circuit 214, a filter 216, mixers 220 and 224, a Gold sequence generator 231, and filters 232 and 236.

As also shown in FIG. 2, circuit 203 includes an I path 205 and a Q path 207. Q path 207 includes the same components as the components in I path 205 and receives the same signals from LNA 206. However, unlike I path 205 which receives LO_0° clock signals (i.e., LO_0°+, LO_0°+b, LO_0°−, and LO_0°−b), Q path 207 receives LO_90°+ signals (i.e., LO_90°+, LO_90°+b, LO_90°−, and LO_90°−b).

As further shown in FIG. 2, unlike in circuit 100, the output of LNA 206 (which is differential) is connected to a differential transconductance $G_m$ amplifier 264 (which can operate in any suitable range (e.g., such as 2.7 to 3.7 GHz)), which has its outputs connected to DC blocking capacitors 266 and 268, which are connected to differential mixer 208. Mixer 208 can be implemented in any suitable manner, such as using four pairs of CMOS transmission gate switches. In some embodiments, a non-overlap generator can be formed by two cross-coupled NAND gates with inverter chains to generate complementary phase clocks for use with transmission gate type passive mixer switches.

The output of mixer 208 is connected to filter 216, which can be implemented in any suitable manner, such as by a transimpedance amplifier that is configured as an RF I/Q filter, in some embodiments.

As still further shown in FIG. 2, circuit 203 includes I paths 209 and Q paths 211, which each include eight branches. Within each branch, there is a mixer (e.g., mixer 220 or 224) and a filter (e.g., filter 232 or 236). The input to these branches is connected to the output of filter 216 (for the I paths) or to the output of the equivalent filter (not shown) in Q path 207.

As yet further shown in FIG. 2, unlike in circuit 100, the output of filter 216 (which is differential) is connected to a differential transconductance $G_m$ amplifier in each branch of I paths 209, the outputs of each amplifier is connected to a differential switch (in the same branch) that is controlled by one of the Gold sequences produced by Gold sequence generator 231 to form a mixer for the branch (e.g., mixer 220 or 224).

The outputs of the mixers in each branch of the I paths 209 and the Q paths 211 are connected to a filter for the branch (e.g., filter 232 or 236). These filters can be implemented in any suitable manner, such as by a transimpedance amplifier that is configured as an RF I/Q filter, in some embodiments.

As still further shown in FIG. 2, Gold sequence generator 231 can be programmable in some embodiments. This can allow the RBW to be changed to different values (e.g., between 20 MHz and 10 MHz) by switching to corresponding PN length options (e.g., between 63-long and 127-long). In some embodiments, Gold sequence generator 231 can generate 8 ($2^n$-1) long Gold sequences by XORing two maximal length m-sequences generated by two n-flip-flop linear feedback shift registers.

As shown in FIG. 2, Gold sequence generator 231 can be clocked at L times RBW (which needs to be equal to or larger than the span) (e.g., a 1.26 GHz clock frequency). In some embodiments, any other suitable clock frequency can be used.

Figure 4:
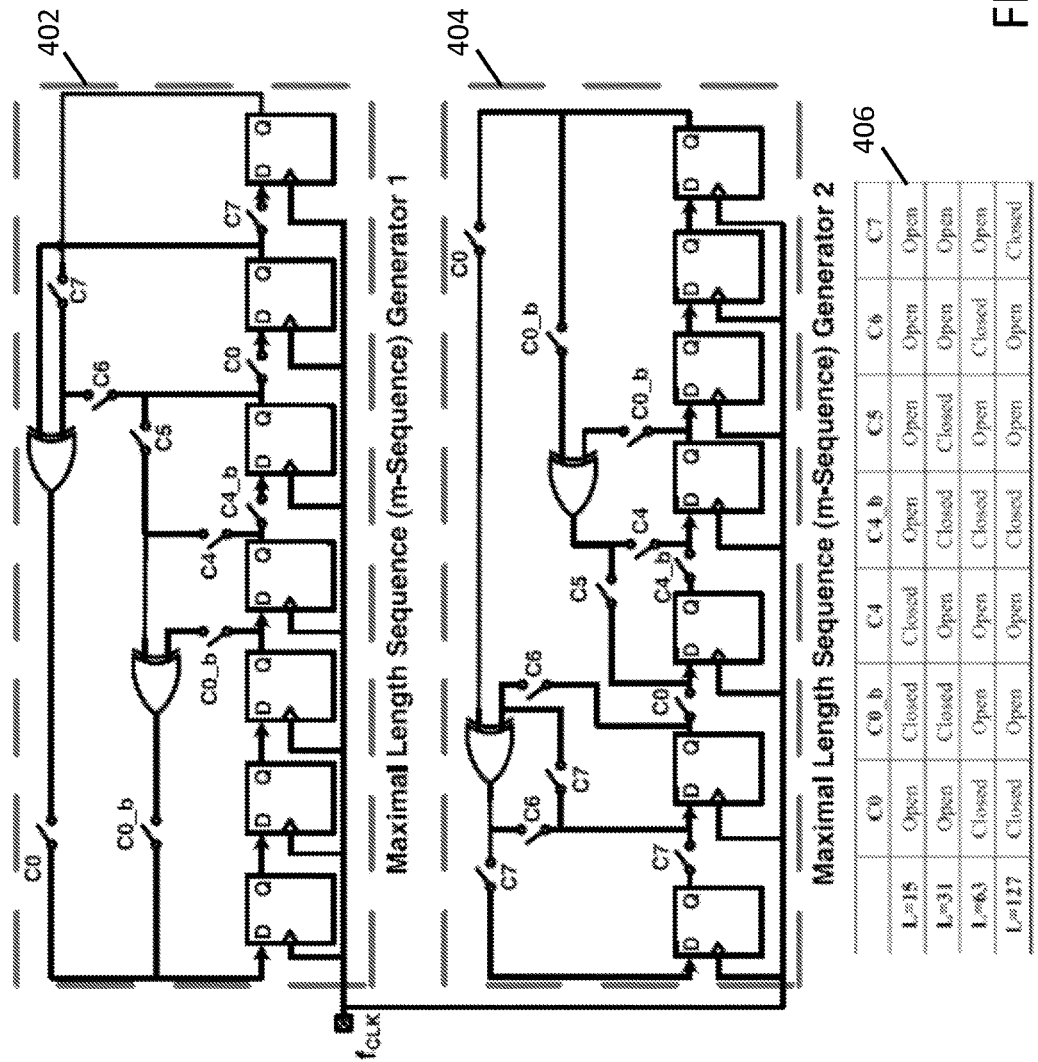
FIG. 4 is an example of a circuit for two maximal length sequence generators that can be used in accordance with some embodiments.
Figure 5:
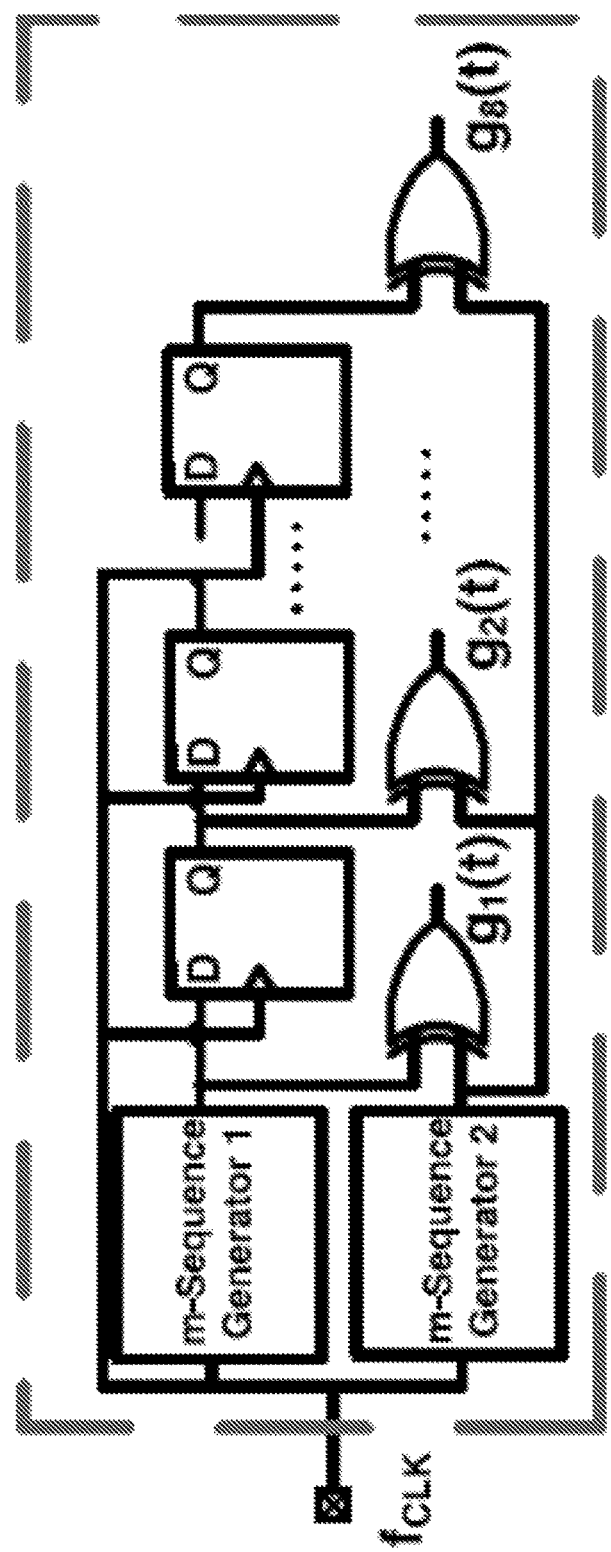
FIG. 5 is an example of a circuit for a Gold sequence generator that can be used in accordance with some embodiments.

FIGS. 4 and 5 show further details of Gold sequence generators that can be used in some embodiments.

As shown in FIG. 4, maximal length sequence generator 1 and maximal length sequence generator 2 shown in the Gold sequence generator 231 of FIG. 2 can be implemented as maximal length sequence generator 1 402 and maximal length sequence generator 2 404, respectively, in some embodiments. By changing the configuration of switches C0, C0$_b$, C4, C4$_b$, C5, C6, and C7, length options of 15, 31, 63 and 127 can be programmed for the Gold sequences output by Gold sequence generator 231 as shown in table 406.

As shown in FIG. 5, in some embodiments, in an alternate version of Gold sequence generator 231, the output flip flops at the outputs of the XOR gates can be omitted and the outputs of the XOR gates provided directly to the mixers of the branches in I paths 209 and Q paths 211.

Any suitable components technologies and sizes can be used to implement the circuit devices shown in FIGS. 1, 2, 4, and 5. For example, in some embodiments, these devices can be implemented in 65 nm CMOS general purpose device technology.

Figure 6:
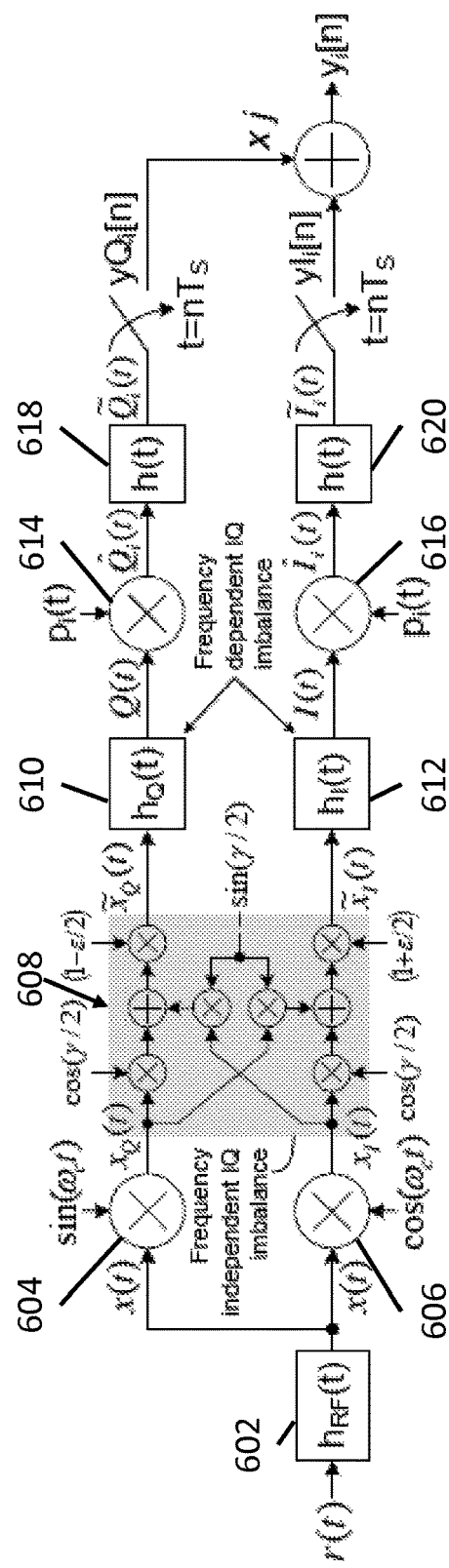
FIG. 6 is an example of a circuit diagram showing theory behind a mechanism for detecting interferers, including linear impairments (I/Q phase and gain imbalance) in accordance with some embodiments.

Turning to FIG. 6, an alternate circuit 600 for detecting interferers in accordance with some embodiment is shown to derive a set of equations that describe the operation of the mechanisms described herein.

For the purposes of illustration, impairments of the downconverter are included in the frequency domain model and only linear impairments are considered. The downconverter frequency independent impairment model at the output of box 608 can be described as follows:

$$\begin{pmatrix} \tilde{x}_I(t) \\ \tilde{x}_Q(t) \end{pmatrix} = \begin{pmatrix} \kappa_{11} & \kappa_{12} \\ \kappa_{21} & \kappa_{22} \end{pmatrix} \begin{pmatrix} x_I(t) \\ x_Q(t) \end{pmatrix}$$

The in-phase (I) and quadrature-phase (Q) local oscillator signals of the downconverter can be modeled as:

$$LO_I = \left(1 + \frac{\varepsilon}{2}\right)\cos\left(\omega_c t + \frac{\gamma}{2}\right)$$

-continued $$LO_Q = \left(1 + \frac{\varepsilon}{2}\right)\sin\left(\omega_c t + \frac{\gamma}{2}\right)$$

wherein, parameters $\varepsilon$ and $\gamma$ specify the downconverter gain imbalance and phase imbalance and their impact on the local oscillators is shown in box 608.

The composite parameters in the downconverter frequency independent impairment model (described above) can be represented by:

$$\kappa_{11} = \left(1 + \frac{\varepsilon}{2}\right)\cos\left(\frac{\gamma}{2}\right)$$

$$\kappa_{12} = -\left(1 + \frac{\varepsilon}{2}\right)\cos\left(\frac{\gamma}{2}\right)$$

$$\kappa_{21} = -\left(1 - \frac{\varepsilon}{2}\right)\cos\left(\frac{\gamma}{2}\right)$$

$$\kappa_{22} = \left(1 - \frac{\varepsilon}{2}\right)\cos\left(\frac{\gamma}{2}\right)$$

The frequency dependent mismatch between the I and Q paths introduced by the downconverter and other components is modeled with $h_I(t)$ 612 and $h_Q(t)$ 610. For the purpose of this analysis, frequency dependent I, Q mismatch is ignored.

Let $x \in \mathcal{M}$ be a sparse multi-band signal received at the input to mixers 604 and 606 from filter 602. I(t) and Q(t) are the filtered outputs of the downconverter presented at the outputs of filters 612 and 610, respectively. Assume that $p_i(t)$ input to mixers 614 and 616 is a $T_p$ periodic PRBS of length $L=2L_0+1$, where $L_0 \in \mathbb{Z}^+$. Let $f_p=1/T_p$ and therefore, $$p_i(t) = \sum_{n=-\infty}^{\infty} b_{i,n} e^{j2\pi n f_p t}$$

The weights $b_{i,n}$ can be evaluated by:

$$b_{i,n} = \begin{cases} \frac{1}{L}\sum_{k=0}^{L-1} \beta_{i,k} & \text{when } n = 0 \\ \sum_{k=0}^{L-1} \beta_{i,k} \theta_n \Psi_{n,k} & \text{when } n \neq 0 \end{cases}$$

where:
$\beta_{i,0} \ldots \beta_{i,L-1}$ are the amplitudes of the ith branch PRBS $$\theta_n = \left(1 - e^{-j\frac{2\pi}{L}n}\right)/j2\pi n$$

$$\Psi_{n,k} = e^{-j\frac{2\pi}{L}nk}$$

The Fourier transform of $\tilde{I}_i(t)=\hat{I}_i(t)*h(t)$ and $\tilde{Q}_i(t)=\hat{Q}_i(t)*h(t)$ at the outputs of filters 620 and 618, respectively, are given by:

$$\tilde{I}_i(f) = \sum_{n=-L_0}^{L_0} b_{i,n}[\kappa_{11}X_I(f-nf_p) + \kappa_{12}X_Q(f-nf_p)]$$

-continued $$\hat{Q}_i(f) = \sum_{n=-L_0}^{L_0} b_{i,n}[\kappa_{21}X_I(f - nf_p) + \kappa_{22}X_Q(f - nf_p)]$$

The inputs $\hat{I}_i(f)$ and $\hat{Q}_i(f)$ to filters 620 and 618, respectively, with impulse response h(t) are linear combinations of the $f_p$ shifted copies of I(f) and Q(f).

Since I(f), Q(f)=0 when f is not in the range $-(f_{MAX}-f_{MIN})/2$ to $(f_{MAX}-f_{MIN})/2$, the Fourier transforms above can be expressed with a finite sum. The signals $\hat{I}_i(t)$ and $\hat{Q}_i(t)$ are sampled at $f_s$ samples per second. The samples $yI_i[n]$ and $yQ_i[n]$ are combined and the output of the complex combine $y_i[n]$ are used to recover the support of the input signal x(t). The Fourier transform of the signals $y_i[n]$ is given by:

$$Y_i(e^{j2\pi fT_S}) = \frac{1}{T_S} \sum_{n=-L_0}^{L_0} \sum_{k=0}^{L-1} \{\beta_{i,k}\Psi_{n,k}\theta_n[\kappa_{11}X_I(f-nf_p)+\kappa_{12}X_Q(f-nf_p)] \mp j\beta_{i,k}$$
$$\Psi_{n,k}\theta_n[\kappa_{21}X_I(f-nf_p)+\kappa_{22}X_Q(f-nf_p)]\}$$

The operation of circuit 600 can be described by:

$$Y(e^{j2\pi fT_S})=A\tilde{z}(f)=\Sigma\tilde{\Phi}\tilde{\Psi}\tilde{\Theta}K\tilde{z}(f)$$

where:
- $\tilde{\Phi}\varepsilon\mathbb{R}^{2m\times 2L}$ is the sensing matrix (shown below);
- $\tilde{\Psi}\varepsilon\mathbb{C}^{2L\times 2L}$ is the dictionary matrix (shown below);
- $\tilde{\Theta}\varepsilon\mathbb{C}^{2L\times 2L}$ is a diagonal matrix (shown below) containing a set of complex weights; and
- the matrices $\Sigma$ and K represent the complex combiner action and the downconverter impairments, respectively.

$$\tilde{\Phi} = \begin{bmatrix} \Phi & 0 \\ 0 & \Phi \end{bmatrix}; \tilde{\Psi} = \begin{bmatrix} \Psi & 0 \\ 0 & \Psi \end{bmatrix}; \tilde{\Theta} = \begin{bmatrix} \Theta & 0 \\ 0 & \Theta \end{bmatrix}$$

The complex combiner action is described by the matrix:

$$\tilde{\Sigma}\varepsilon\mathbb{C}^{m\times 2m}$$

given by:

$$\Sigma = \begin{bmatrix} 1 & \cdots & 0 & \mp j & \cdots & 0 \\ \vdots & \ddots & \vdots & \vdots & \ddots & \vdots \\ 0 & \cdots & 1 & 0 & \cdots & \mp j \end{bmatrix}$$

The block diagonal matrices $$\tilde{\Phi}\varepsilon\mathbb{R}^{2m\times 2L}$$
$$\tilde{\Psi}\varepsilon\mathbb{C}^{2L\times 2L}$$
$$\tilde{\Theta}\varepsilon\mathbb{C}^{2L\times 2L}$$

described above include the matrices $$\tilde{\Phi}\varepsilon\mathbb{R}^{m\times L}$$
$$\tilde{\Psi}\varepsilon\mathbb{C}^{L\times L}$$
$$\tilde{\Theta}\varepsilon\mathbb{C}^{L\times L}$$

respectively.

The rows of the matrix $\Phi$ contain the amplitudes of the m unique pseudo-random bit sequences employed by the mechanisms described herein. $\Psi$ is a discrete Fourier transform matrix and $\Theta$ is a diagonal matrix containing the complex weights:

$$\theta_n = \left(1 - e^{-j\frac{2\pi}{L}n}\right)/j2\pi n$$

The action of the quadrature RF downconverter with frequency independent linear impairments is described by the matrix $K\varepsilon\mathbb{R}^{2L\times 2L}$ as follows:

$$\mathcal{K} = \begin{bmatrix} \kappa_{11} & \cdots & 0 & \kappa_{1,2} & \cdots & 0 \\ \vdots & \ddots & \vdots & \vdots & \ddots & \vdots \\ 0 & \cdots & \kappa_{11} & 0 & \cdots & \kappa_{12} \\ \kappa_{2,1} & \cdots & 0 & \kappa_{22} & \cdots & 0 \\ \vdots & \ddots & \vdots & \vdots & \ddots & \vdots \\ 0 & \cdots & \kappa_{2,1} & 0 & \cdots & \kappa_{22} \end{bmatrix}$$

Note that K is an identity matrix for an impairment free downconverter.

The vector $\tilde{z}(f) \varepsilon \mathbb{C}^{2L}$ in $Y(e^{j2\pi fT_s})=A\tilde{z}(f)=\Sigma\tilde{\Phi}\tilde{\Psi}\tilde{\Theta}k\tilde{z}(f)$ includes all of the $(2L_0+1)$ frequency shifts of $X_I(f)$ and $X_Q(f)$ by $f_p$ Hz. The vector $\tilde{z}(f)$ can be described as follows:

$$\tilde{z}(f) = \begin{cases} \frac{1}{2}[X(f-f_c+L_0f_p)+X(f+f_c+L_0f_p)] \\ \vdots \\ \frac{1}{2j}[X(f-f_c-L_0f_p)+X(f+f_c-L_0f_p)] \\ \frac{1}{2j}[X(f-f_c+L_0f_p)-X(f+f_c+L_0f_p)] \\ \vdots \\ \frac{1}{2j}[X(f-f_c-L_0f_p)-X(f+f_c-L_0f_p)] \end{cases}$$

Given $Y(e^{j2\pi fT_s})=A\tilde{z}(f)=\Sigma\tilde{\Phi}\tilde{\Psi}\tilde{\Theta}k\tilde{z}(f)$, we can attempt to recover the sparse vectors $\tilde{z}(f)$ from measurements Y(f), and hence determine the frequency support of the input signal x(t). This can be done efficiently using techniques from convex optimization if the matrix A respects the geometry of the sparse vector $\tilde{z}(f)$. Specifically, if for a small constant δ, the following equation holds, then the sampling and reconstruction procedure will succeed:

$$(1-\delta)\|s\|_2^2 \leq \|As\|_2^2 \leq (1+\delta)\|s\|_2^2 \; \forall 2K_0\text{-sparse } s$$

For example, if in $Y(e^{j2\pi fT_s})=A\tilde{z}(f)=A\tilde{z}(f)=\Sigma\tilde{\Phi}\tilde{\Psi}\tilde{\Theta}K\tilde{z}(f)$, $\tilde{\Phi}$ is a random matrix (say with entries independent uniform±1), the product $\tilde{\Phi}\tilde{\Psi}$ satisfies the requirement $$(1-\delta)\|s\|_2^2 \leq \|As\|_2^2 \leq (1+\delta)\|s\|_2^2 \; \forall 2K_0\text{-sparse } s$$

with high probability.

Figure 7:
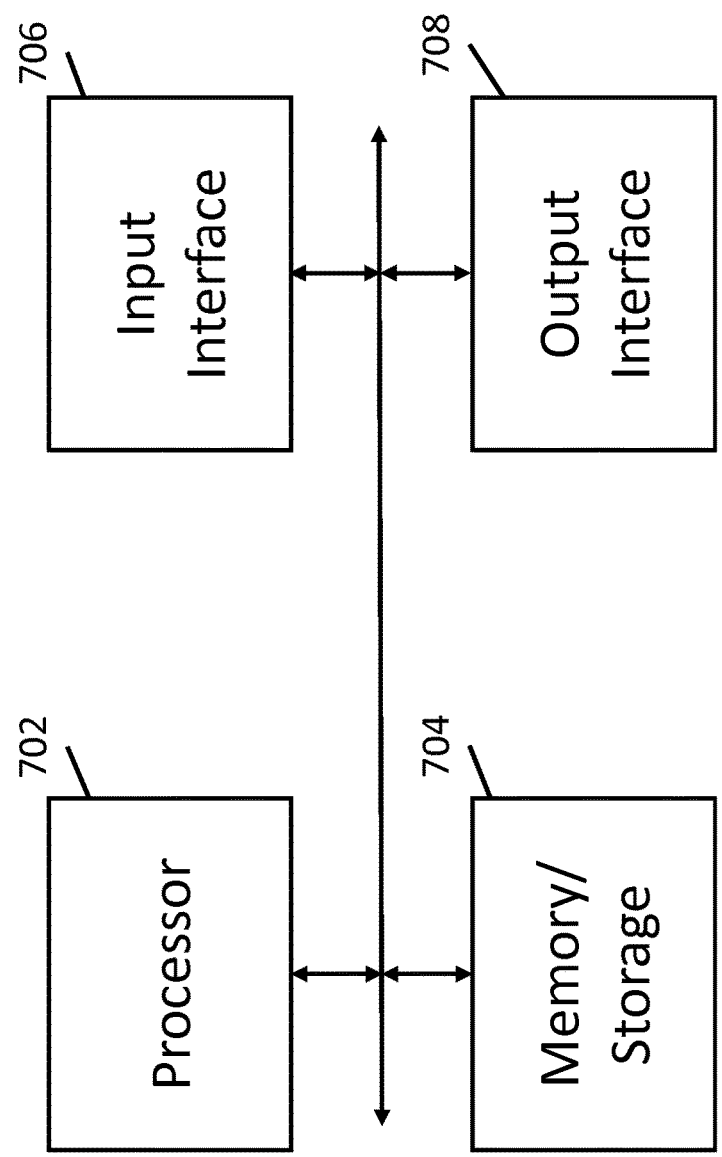
FIG. 7 is an example of hardware that can be used to implement a support recovery block, a signal reconstruction block, a system controller and user interface, and/or any other suitable portions of the circuits described herein in accordance with some embodiments.

FIG. 7 illustrates an example 700 of hardware that can be used to implement one or more of support recovery block 158, signal reconstruction block 160, and system control and user interface 162. In some of more embodiments, two or more of support recovery block 158, signal reconstruction block 160, and system control and user interface 162 can be implemented in the same or different hardware 700.

As shown in FIG. 7, hardware 700 can include a hardware processor 702, memory/storage 704, an input interface 706, an output interface 708, and/or any other suitable components, which can be interconnected. Hardware 700 can be implemented in some embodiments as any of a general purpose device (such as a computer) or a special purpose device (such as a client, a server, etc.).

Hardware processor 702 can be any suitable hardware device for performing the functions associated with support recovery block 158, signal reconstruction block 160, system control and user interface 162, and/or any other component described herein, such as a microprocessor, a digital signal processor, a controller, etc., in some embodiments. For example, hardware processor 702 can execute instructions stored in memory/storage 704 for performing such functions.

In some embodiments, memory/storage 704 can be any suitable memory and/or storage, such as random access memory, read only memory, programmable read only memory, flash memory, a hard disk, a solid state drive, non-transitory computer-readable media, etc. This memory/storage can store any suitable instructions, programs, data, information, etc.

Input interface 706 can be any suitable interface for receiving data, programs, and/or any other suitable digital information.

Output interface 708 can be any suitable interface for transmitting and/or presenting (e.g., via audio, video, etc.) data, programs, and/or any other suitable digital information.

In some embodiments, any suitable computer readable media can be used for storing instructions for performing the functions and/or processes described herein. Such computer readable media can be part of, or separate from, storage/memory 704. For example, in some embodiments, computer readable media can be transitory or non-transitory. For example, non-transitory computer readable media can include media such as magnetic media (such as hard disks, floppy disks, etc.), optical media (such as compact discs, digital video discs, Blu-ray discs, etc.), semiconductor media (such as random access memory (RAM), flash memory, electrically programmable read only memory (EPROM), electrically erasable programmable read only memory (EEPROM), etc.), any suitable media that is not fleeting or devoid of any semblance of permanence during transmission, and/or any suitable tangible media. As another example, transitory computer readable media can include signals on networks, in wires, conductors, optical fibers, circuits, any suitable media that is fleeting and devoid of any semblance of permanence during transmission, and/or any suitable intangible media.

The provision of the examples described herein (as well as clauses phrased as "such as," "e.g.," "including," and the like) should not be interpreted as limiting the claimed subject matter to the specific examples; rather, the examples are intended to illustrate only some of many possible aspects. It should also be noted that, as used herein, the term mechanism can encompass hardware, software, firmware, or any suitable combination thereof.

Accordingly, mechanisms (which can include circuits, systems, methods, and computer readable media) for detecting interferers in a frequency range are provided.

Although the invention has been described and illustrated in the foregoing illustrative embodiments, it is understood that the present disclosure has been made only by way of example, and that numerous changes in the details of implementation of the invention can be made without departing from the spirit and scope of the invention, which is limited only by the claims that follow. Features of the disclosed embodiments can be combined and rearranged in various ways.

What is claimed is:

1. A circuit for detecting interferers, the circuit comprising:
a first in-phase mixer that receives and mixes a radio frequency (RF) signal and an in-phase local oscillator signal to produce a first in-phase mixer output signal;
a first quadrature-phase mixer that receives and mixes the radio frequency (RF) signal and a quadrature-phase local oscillator signal to produce a first quadrature-phase mixer output signal;
a first in-phase filter that receives and filters the first in-phase mixer output signal to produce a first in-phase filtered signal;
a first quadrature-phase filter that receives and filters the first quadrature-phase mixer output signal to produce a first quadrature-phase filtered signal;
a first in-phase branch that comprises:
a second in-phase mixer that receives and mixes the first in-phase filtered signal and a first pseudorandom noise signal to produce a second in-phase mixer output signal;
a second in-phase filter that receives and filters the second in-phase mixer output signal to produce a second in-phase filtered signal; and
a first in-phase analog-to-digital converter that receives the second in-phase filtered signal to produce a first in-phase digitized signal;
a second in-phase branch that comprises:
a third in-phase mixer that receives and mixes the first in-phase filtered signal and a second pseudorandom noise signal to produce a third in-phase mixer output signal;
a third in-phase filter that receives and filters the third in-phase mixer output signal to produce a third in-phase filtered signal; and
a second in-phase analog-to-digital converter that receives the third in-phase filtered signal to produce a second in-phase digitized signal;
a first quadrature-phase branch that comprises:
a second quadrature-phase mixer that receives and mixes the first quadrature-phase filtered signal and the first pseudorandom noise signal to produce a second quadrature-phase mixer output signal;
a second quadrature-phase filter that receives and filters the second quadrature-phase mixer output signal to produce a second quadrature-phase filtered signal; and
a first quadrature-phase analog-to-digital converter that receives the second quadrature-phase filtered signal to produce a first quadrature-phase digitized signal;
a second quadrature-phase branch that comprises:
a third quadrature-phase mixer that receives and mixes the first quadrature-phase filtered signal and the second pseudorandom noise signal to produce a third quadrature-phase mixer output signal;
a third quadrature-phase filter that receives and filters the third quadrature-phase mixer output signal to produce a third quadrature-phase filtered signal; and
a second quadrature-phase analog-to-digital converter that receives the third quadrature-phase filtered signal to produce a second quadrature-phase digitized signal;
a complex combiner that combines the first in-phase digitized signal and the first quadrature-phase digitized signal to produce a first combined signal and that combines the second in-phase digitized signal and the second quadrature-phase digitized signal to produce a second combined signal; and at least one hardware processor that receives the first combined signal and the second combined signal and that identifies at least one interferer in the RF signal using the first combined signal and the second combined signal.

2. The circuit of claim 1, further comprising a low noise amplifier configured to amplify an input signal to produce the RF signal.

3. The circuit of claim 2, wherein the at least one hardware processor also determines an estimate of the input signal using the first combined signal and the second combined signal.

4. The circuit of claim 1, wherein the quadrature-phase local oscillator signal is shifted 90 degrees from the in-phase local oscillator signal.

5. The circuit of claim 1, wherein the first pseudorandom noise signal and the second pseudorandom noise signal are Gold sequences.

6. The circuit of claim 5, further comprising a Gold sequence generator configured to generate the Gold sequences.

7. A method for detecting interferers, the method comprising:

mixing a radio frequency (RF) signal and an in-phase local oscillator signal to produce a first in-phase mixer output signal;

mixing the radio frequency (RF) signal and a quadrature-phase local oscillator signal to produce a first quadrature-phase mixer output signal;

filtering the first in-phase mixer output signal to produce a first in-phase filtered signal;

filtering the first quadrature-phase mixer output signal to produce a first quadrature-phase filtered signal;

mixing the first in-phase filtered signal and a first pseudorandom noise signal to produce a second in-phase mixer output signal;

filtering the second in-phase mixer output signal to produce a second in-phase filtered signal;

analog-to-digital converting the second in-phase filtered signal to produce a first in-phase digitized signal;

mixing the first in-phase filtered signal and a second pseudorandom noise signal to produce a third in-phase mixer output signal;

filtering the third in-phase mixer output signal to produce a third in-phase filtered signal;

analog-to-digital converting the third in-phase filtered signal to produce a second in-phase digitized signal;

mixing the first quadrature-phase filtered signal and the first pseudorandom noise signal to produce a second quadrature-phase mixer output signal;

filtering the second quadrature-phase mixer output signal to produce a second quadrature-phase filtered signal;

analog-to-digital converting the second quadrature-phase filtered signal to produce a first quadrature-phase digitized signal;

mixing the first quadrature-phase filtered signal and the second pseudorandom noise signal to produce a third quadrature-phase mixer output signal;

filtering the third quadrature-phase mixer output signal to produce a third quadrature-phase filtered signal;

analog-to-digital converting the third quadrature-phase filtered signal to produce a second quadrature-phase digitized signal;

combining the first in-phase digitized signal and the first quadrature-phase digitized signal to produce a first combined signal and combining the second in-phase digitized signal and the second quadrature-phase digitized signal to produce a second combined signal; and identifying at least one interferer in the RF signal using the first combined signal and the second combined signal.

8. The method of claim 7, further comprising amplifying an input signal to produce the RF signal using a low noise amplifier.

9. The method of claim 8, further comprising determining an estimate of the input signal using the first combined signal and the second combined signal.

10. The method of claim 7, wherein the quadrature-phase local oscillator signal is shifted 90 degrees from the in-phase local oscillator signal.

11. The method of claim 7, wherein the first pseudorandom noise signal and the second pseudorandom noise signal are Gold sequences.

12. The method of claim 11, further comprising generating the Gold sequences using a Gold sequence generator.

* * * * *